United States Patent
Lee et al.

(10) Patent No.: US 7,804,367 B2
(45) Date of Patent: Sep. 28, 2010

(54) FREQUENCY SYNTHESIZER AND FREQUENCY CALIBRATION METHOD

(75) Inventors: Jeong Cheol Lee, Gyeonggi-Do (KR); Moon Kyung Ahn, Gyeonggi-Do (KR)

(73) Assignee: FCI Inc., Seongnam-si, Gyeonggi-do (KR)

( * ) Notice: Subject to any disclaimer, the term of this patent is extended or adjusted under 35 U.S.C. 154(b) by 423 days.

(21) Appl. No.: 11/872,779

(22) Filed: Oct. 16, 2007

(65) Prior Publication Data

US 2008/0106340 A1    May 8, 2008

(30) Foreign Application Priority Data

Oct. 20, 2006    (KR) .................. 10-2006-0102283

(51) Int. Cl.
*H03L 7/00* (2006.01)
(52) U.S. Cl. .................. 331/16; 331/34; 331/177 R; 331/179; 327/156
(58) Field of Classification Search .............. 331/16, 331/34, 177 R, 179; 327/156
See application file for complete search history.

(56) References Cited

U.S. PATENT DOCUMENTS

| | | | | |
|---|---|---|---|---|
| 5,942,949 A | * | 8/1999 | Wilson et al. | 331/17 |
| 6,552,618 B2 | * | 4/2003 | Nelson et al. | 331/11 |
| 7,375,595 B2 | * | 5/2008 | Serrano et al. | 331/44 |
| 7,495,517 B1 | * | 2/2009 | Hoang et al. | 331/16 |

* cited by examiner

*Primary Examiner*—Arnold Kinkead
(74) *Attorney, Agent, or Firm*—Jae Y. Park; Kile Goekjian Reed & McManus

(57) ABSTRACT

A frequency synthesizer capable of using a voltage controlled oscillator (VCO) with a low value of gain $K_{vco}$, having a short automatic frequency calibration time and automatically coping with environments and a frequency calibration method are provided. The frequency synthesizer includes a reference divider, a phase detector, a main divider, a charge pump, a loop filter, a first switch, a second switch, a VCO, and an automatic frequency calibration block. The frequency calibration method includes an initialization step, an N-target algorithm step, an auxiliary search algorithm step, and a post search algorithm step.

18 Claims, 5 Drawing Sheets

FREQUENCY SYNTHESIZER AND FREQUENCY CALIBRATION METHOD

This application claims priority to Korean Patent Application No. 10-2006-0102283, filed on Oct. 20, 2006, all the benefits accruing therefrom under 35 U.S.C. §119, the contents of which in their entirety are incorporated herein by reference.

BACKGROUND OF THE INVENTION

1. Field of the Invention

The present invention relates to a frequency synthesizer, and more particularly, to a frequency synthesizer capable of using a voltage controlled oscillator (VCO) with a low gain $K_{vco}$, improving phase noise characteristics, having a short automatic frequency calibration time, and automatically coping with a change of environments.

2. Description of the Related Art

Integrated circuits (ICs) for wireless transceivers are necessarily designed to satisfy conditions of low power consumption and low production cost. In design of such a wireless transceiver satisfying the condition, one of the most important components is a frequency synthesizer. Among various types of conventional frequency synthesizers, fractional-N frequency synthesizers which operate at a high speed are preferred rather than integer-N frequency synthesizers. Here, N is an integer.

FIG. 1 is a block diagram illustrating a conventional fractional-N frequency synthesizer.

Referring to FIG. 1, the conventional fractional-N frequency synthesizer 100 include a reference divider 110, a phase detector 120, a charge pump 130, a loop filter 140, a VCO 150, an automatic frequency calibration block 160, a main divider 170, and two switches S1 and S2.

The reference divider 110 divides a frequency of a reference signal $f_{ref}$ with a division ratio of 1/R. Here, R is an integer which is determined based on characteristics of a system in which the frequency synthesizer 100 is used. The system may be a wireless transceiver.

The main divider 170 outputs an output voltage generated by the VCO 150 with a division ratio of 1/(N×P). Here, P is an integer. The main divider 170 includes a pre-scaler 171, a program divider 172, and a sigma-delta (Σ−Δ) modulator 173. The pre-scaler 171 divides a frequency of the output signal $V_{out}$ with a division ratio of 1/P. The program divider 172 divides a signal output from the pre-scaler 171 with a division ratio of 1/N. The sigma-delta modulator 173 generates the division control signal DC in response to a signal output from the program divider 172. A value of divide number N for the program divider 172 is determined based on the division control signal DC.

The phase detector 120 compares a phase of the signal output form the reference divider 110 and a phase of the signal output from the main divider 170 and outputs a pulse corresponding to a phase difference between the two signals. The charge pump 130 increases or decreases the number of charges according to width and sign of the pulse output from the phase detector 120 to change an output current.

An iteration process for generating the signal $f_{out}$ having a predetermined frequency from the reference signal having the reference frequency $f_{ref}$ inevitably causes occurrence of noise components. The loop filter 140 removes the noises occurring during the loop operation. The loop filter 140 includes an array of resisters and capacitors which are serially connected to each other in the loop filter. Therefore, the loop filter 140 can remove the noises included in the output current output from the charge pump 130. In addition, the pumping voltage $V_{cp}$ is generated by charging or discharging the output current through the capacitors of the loop filter.

The automatic frequency calibration block 160 outputs a frequency control signal $AFC_{out}$ corresponding to a frequency difference between the signal output from the reference divider 110 and the signal output form the main divider 170 and two switch control signals GW1 and GW2. The automatic frequency calibration block 160 includes a frequency detector 161 and a state machine 162. The frequency detector 161 compares the frequency of the signal obtained by the reference divider 110 with a division number of 1/R and the frequency of the signal obtained by the main divider 170 with a division number of 1/(N×P) and outputs a comparison signal corresponding to the frequency difference. The state machine 162 generates the frequency control signal $AFC_{out}$ having information on the frequency $f_{out}$ of the output signal that is to be generated by the VCO 150 and the switch control signal GW1 and GW2 for controlling the two switches S1 and S2 by using the comparison signal output from the frequency detector 161.

The VCO 150 generates an output signal $f_{out}$ in response to a control voltage VC and the frequency control signal $AFC_{out}$. The control voltage VC is selected from one of the reference voltage $V_{ref}$ and the pumping voltage $V_{cp}$ output from the loop filter 140 according to a state of the two switches S1 and S2 that are operated by the switch control signals GW1 and GW2 generated from the state machine 162.

As described above, the conventional fractional-N frequency synthesizer 100 performs a general frequency calibration function by using the automatic frequency calibration block 160. The conventional automatic frequency calibration block 160 can calibrate the frequency four of the output signal by using a frequency difference between the signal output from the reference divider 110, that is, a divide-by-R frequency divider and the signal output form the main divider 170, that is, a divide-by-N frequency divider.

In order to reduce the time taken to perform the automatic frequency calibration, the frequency of the signal output from the reference divider 110 needs, to be increased by a multiplication number L (L is an integer). Therefore, a frequency resolution of the banks in the VOC 150 is also increased by the multiplication number L. Accordingly, the steps of the banks are increased. As a result, the gain $K_{vco}$ of the VCO needs to be increased.

The gain $K_{vco}$ of the VCO is defined as a ratio of the voltage input to the VCO and the frequency of the output signal. As well-known in the art, the gain $K_{vco}$ of the VCO is increased, the phase noises are also increased. Namely, in the conventional frequency synthesizer, the phase noise is inevitably increased in order to reduce the time for the automatic frequency calibration.

In addition, one bank included in the VCO is initially determined to be suitable for the environments. Once the one bank is determined, the bank step cannot be changed. Therefore, after the bank is determined, the bank step cannot be modified to be suitable for a change in the environments such as a system or a change in temperature of the system. As a result, the VCO or the frequency synthesizer may be abnormally operated in an actual field.

SUMMARY OF THE INVENTION

The present invention provides a frequency synthesizer capable of using a voltage controlled oscillator VCO with a low gain $K_{vco}$, rapidly calibrating a frequency, and preventing malfunction of a phase look loop (PLL) caused from a change in temperature.

The present invention also provides a frequency calibration method capable of using a voltage controlled oscillator VCO with a low gain $K_{vco}$, rapidly calibrating a frequency, and preventing malfunction of a phase look loop (PLL) caused from a change in temperature.

According to an aspect of the present invention, there is provide a frequency synthesizer comprising: a reference divider which divides a frequency of a reference signal with a division ratio of 1/(R1); a phase detector which outputs a pulse corresponding to a phase difference between a fine mode signal and a signal output from the reference divider; a main divider which outputs a coarse mode signal and the fine mode signal by using the output signal of the reference divider; a charge pump which generates a pumping voltage corresponding to charges which are charged or discharged according to a width and sign of the pulse output from the phase detector; a loop filter which removes noises generated during operation of frequency calibration loop and determines a voltage level of the pumping voltage corresponding to the charges charged or discharged from the charge pump by using a built-in capacitor; a first switch which transfers the pumping voltage applied to the one terminal thereof to a VCO (voltage controlled oscillator) connected to the other terminal thereof in response to a first switch control signal; a second switch which transfers a reference voltage applied to the one terminal thereof to the VCO connected to the other terminal in response to a second switch control signal; the VCO which outputs a frequency control signal and the output signal corresponding to a control voltage applied through the first and second switches; and an automatic frequency calibration block which generates the frequency control signal the first switch control signal, and the second switch control signal in response to the pumping voltage, the reference signal, and the coarse mode signal.

According to another aspect of the present invention, there is provide a frequency calibration method in the frequency synthesizer of claim 5, comprising: an initialization step of determining an arbitrary one of banks built in the VCO as an initial bank and determining an iteration variable and an N-target value; an N-target algorithm step of calculating an N-generation value by using the reference signal and the coarse mode signal that is generated by dividing the frequency of the oscillating signal generated by using the initial bank and changing a bank number by using a difference between the N-target value and the N-generation value according to the iteration variable; an auxiliary search algorithm step of searching for an optimum bank if a bank determined by using the N-target algorithm is determined to be the optimum bank; and a post search algorithm step of performing frequency calibration from the N-target algorithm again when a predetermined time elapses after determination of the optimum bank in the N-target algorithm step and/or the auxiliary search algorithm step, if the previously-determined bank is determined not to be the optimum bank.

The present invention can be summarized as follows.

The VCO outputs the oscillating signal having a predetermined frequency corresponding to the control voltage. In order to generate the oscillating signal adaptively coping with a change in time of the control signal, a plurality of banks are provided to the VCO. Each of the banks is designed to suitably cope with a change of the control voltage in a predetermined range. The frequency synthesizer determines the optimum bank under the given conditions and generates the oscillating signal having the predetermined frequency by using the optimum bank. In order to determine the optimum bank, there is a need for no phase difference between the oscillating signal and a reference signal. In a conventional frequency synthesizer, the optimum bank is searched by using a linear search scheme.

The present invention is contrived based on the fact that the bank located at the center of a plurality of the banks of the VCO is most frequently used. Therefore, in a bank initialization step, a bank corresponding to a central value of a control signal is used as an initial reference bank so as to search for the optimum bank. Next, in a coarse mode, a bank that is determined to be probably the optimum bank or a bank close to the determined bank is searched in a short time by using the initial reference bank. Next, more accurate search process (fine mode) is performed. Therefore, an AFC lock time can be greatly reduced (N-target algorithm). Here, the AFC lock time denotes a time taken to generate the output signal having the predetermined frequency by using a reference signal. If needed, in addition to the coarse mode and the fine mode, an additional process for searching the optimum bank may be performed (auxiliary search algorithm).

In addition, according to the present invention, after the optimum bank is determined, a change of a system where the VCO is implemented and environments of the system may be continuously monitored (post search algorithm). Accordingly, if the currently-set optimum bank needs to be modified to a new optimum bank, the bank can be modified.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, exemplary embodiments of the present invention are described in detail with reference to the accompanying drawings.

Figure 1:
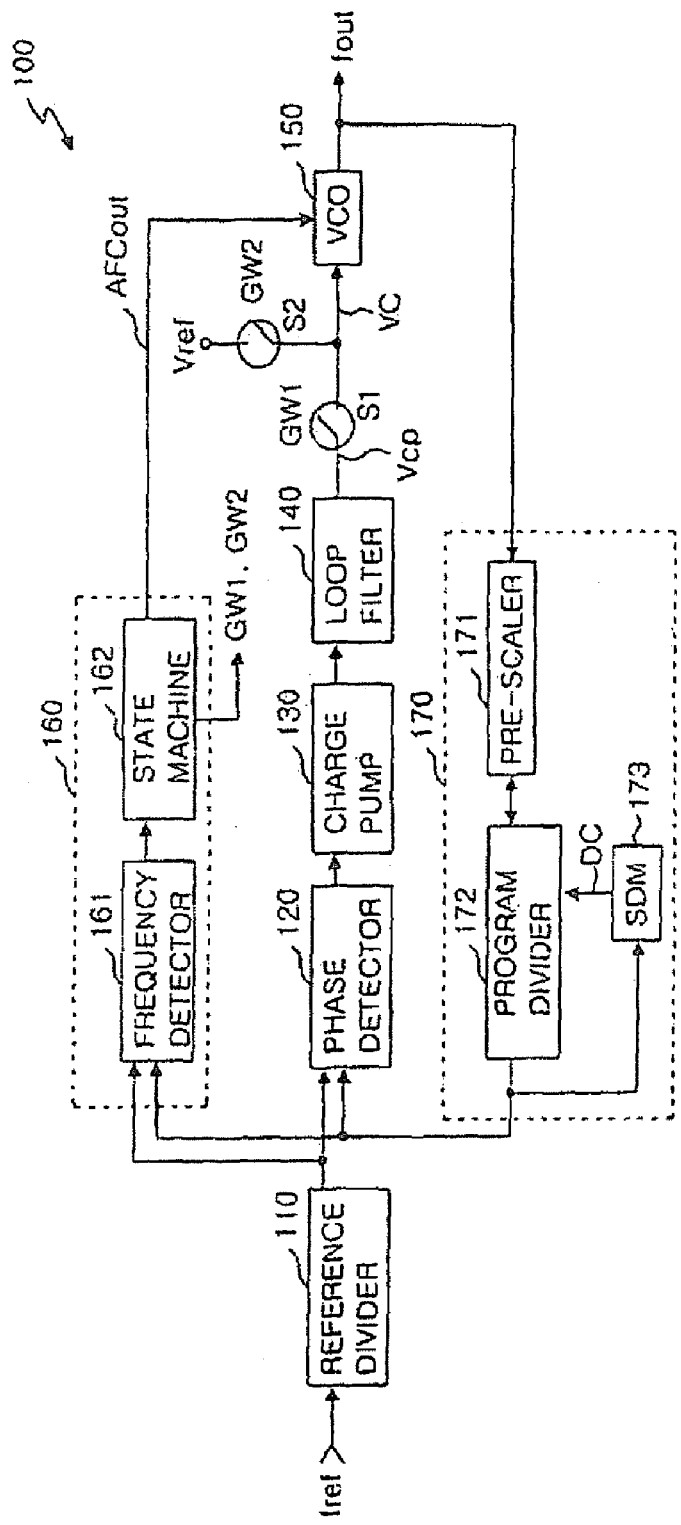
FIG. 1 is a block diagram illustrating a conventional fractional-N frequency synthesizer.
Figure 2:
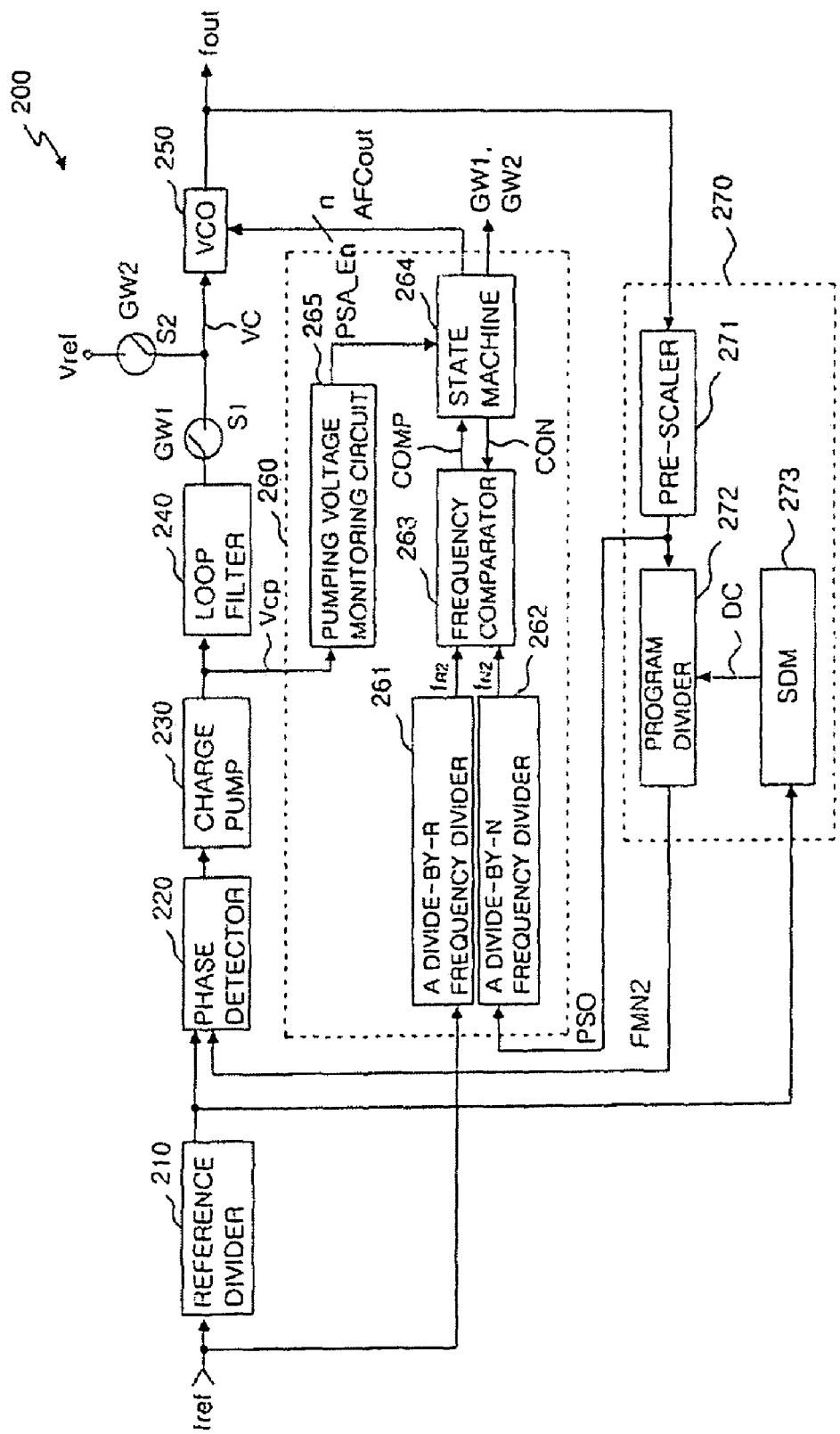
FIG. 2 is a block diagram illustrating a frequency synthesizer according to an embodiment of the present invention.

FIG. 2 is a block diagram illustrating a frequency synthesizer 200 according to an embodiment of the present invention.

Referring to FIG. 2, the frequency synthesizer 200 includes a reference divider 210, a phase detector 220, a charge pump 230, a loop filter 240, two switches S1 and S2, a voltage controlled oscillator (VCO) 250, an automatic frequency calibration block 260, and a main divider 270.

The reference divider 210 divides a frequency of a reference signal $f_{ref}$ with a division ratio of 1/(R1). Here, R1 is an integer which is determined based on characteristics of a system in which the frequency synthesizer 200 is used.

The main divider 270 outputs a coarse mode signal PSO and a fine mode signal FMN2 by using the output signal of the reference divider 210 and the output signal $f_{out}$ of the VCO 250. The main divider 270 includes a pre-scaler 271, a program divider 272, and a sigma-delta (Σ-Δ) modulator 273.

The pre-scaler 271 divides a frequency of the output signal $f_{out}$ with a ration of 1/P (P is an integer) to generate the aforementioned coarse mode signal PSO. The program divider 272 divides the coarse mode signal PSO output from the pre-scaler 271 with a ratio of 1/(N1) (N1 is an integer) in response to a division control signal DC to generate the aforementioned fine mode signal FMN2. Here, a value of the N1 is changed in response to the division control signal DC. The sigma-delta modulator 273 modulates the signal output from the reference divider 210 to generate the aforementioned division control signal DC. Here, the sigma-delta modulator 273 preferably has a fourth-order multistage-noise-shaping (MASH) structure having an operational stability, a good noise shape, and a 20-bit resolution.

In general, a frequency of the output signal $f_{out}$ of the VCO 250 is higher than that of the reference frequency signal $f_{ref}$. Therefore, the frequency of the P-divided signal output from the pre-scaler 271 is higher than those of the R1-divided signal output from the reference divider 210 and the N1-divided signal output from the program divider 272. In addition, the frequency of the signal output from the program divider 272 is higher than that of the signal output from the reference divider 210. For this reason, according to the present invention, a coarse mode of an N-target algorithm is performed, so that an optimum bank or a bank closest to the optimum bank can be searched in a shot time.

The phase detector 220 compares a phase of the signal output from the reference divider 210 and a phase of a fine mode signal FMN2 output from the main divider 270 and outputs a pulse corresponding to a phase difference between two signals. The charge pump 230 increases or decreases generating charges corresponding to a width and sign of a pulse output from the phase detector 220 and generates a pumping voltage $V_{cp}$ which is determined according to a relationship to the connected loop filter 240. The loop filter 240 removes noises generated during operations of a frequency calibration loop and generates the pumping voltage $V_{cp}$ corresponding to an output current which is output from the charge pump 230 through an internal capacitor.

The first switches S1 transfers the pumping voltage $V_{cp}$ output from the loop filter 240 connected to the one terminal thereof to the VCO 250 connected to the other terminal thereof in response to a first switch control signal GW1. The second switches S2 transfers the reference voltage $V_{ref}$ connected to the one terminal thereof to the VCO 250 connected to the other terminal thereof in response to a second switch control signal GW2. The voltages transferred by the two switches S1 and S2 are referred to as control voltages VC. The two switch control signals GW1 and GW2 are exclusively enabled. Namely, if the one switch is turned on, the other switch is turned off.

The automatic frequency calibration block 260 generates a frequency control signal $AFC_{out}$ and the switch control signals GW1 and GW2 in response to the pumping voltage $V_{cp}$ output from the charge pump 230, the reference signal $f_{ref}$, and the coarse mode signal PSO. The automatic frequency calibration block 260 includes a divide-by-R frequency divider 261, a divide-by-N frequency divider 262, a frequency comparator 263, a state machine 264, and a pumping voltage monitoring circuit 265.

The divide-by-R frequency divider 261 divides the frequency of the reference signal $f_{ref}$ with a division ration of 1/(R2). Here, R2 is an integer.

The divide-by-N frequency divider 262 divides the frequency of the coarse mode signal PSO with a division ration of 1/(N2).

For fast frequency calibration, the R1 and the R2 are set to be different from each other. Preferably, the R2 is set to be smaller than the R1.

The frequency comparator 263 compares frequencies of the signals $f_{R2}$ and $f_{N2}$ output from the divide-by-R frequency divider 262 and the divide-by-N frequency divider 262 respectively in response to the control signal CON and outputs the comparison signal COMP corresponding to a frequency difference. The state machine 264 generates the frequency control signal $AFC_{out}$ having information on the frequency of the output signal $f_{out}$ which is to be generated by the VCO 250, the switch control signals GW1 and GW2 for controlling the two switches, and the control signal CON for controlling operations of the frequency comparator 263 by using the comparison signal COMP output from the frequency comparator 263 and a bank adjusting enable signal PSA_En output from the pumping voltage monitoring circuit 265.

The pumping voltage monitoring circuit 265 compares a voltage level of the pumping voltage $V_{cp}$ output from the charge pump 230 with a predetermined reference value to generate the bank adjusting enable signal PSA_En. The reference value is, for example, a minimum voltage and a maximum voltage that can be covered by a currently-set bank.

The VCO 250 generates the output signal $f_{out}$ in response to the frequency control signal $AFC_{out}$ and the control voltage VC transferred through one of the two switches S1 and S2.

When the first switches S1 is turned on, the control voltage VC is applied to the VCO 250. When the second switches S2 is turned on, the reference voltage $V_{ref}$ is applied to the VCO 250. The first switch S1 is turned on if the first switch control signal GW1 generated by the state machine 262 is enabled, and the second switch S2 is turned on if the second switch control signal GW2 generated by the state machine 262 is enabled.

Figure 3:
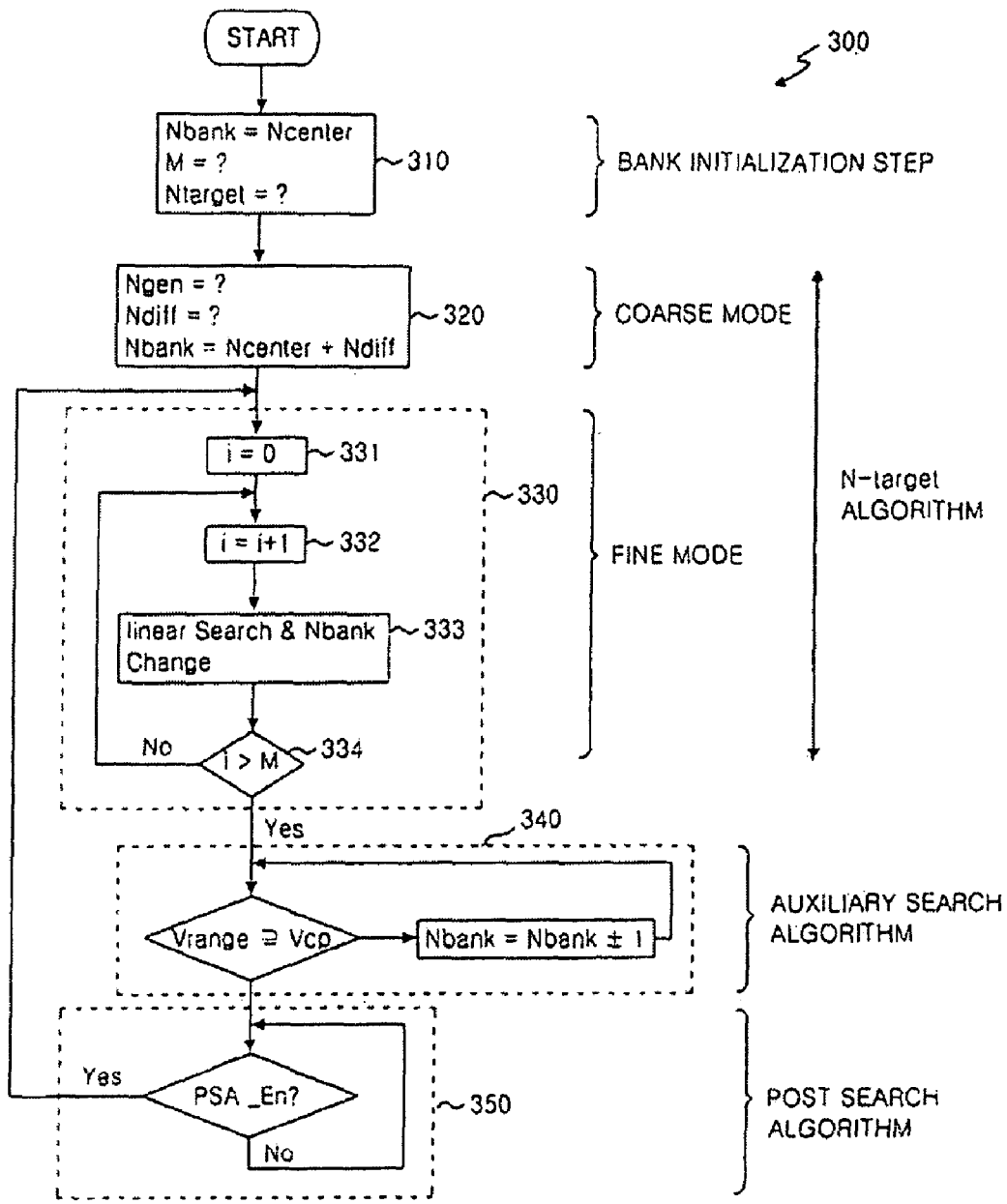
FIG. 3 is a signal flowchart illustrating a frequency calibration method according to another embodiment of the present invention.

FIG. 3 is a signal flowchart illustrating a frequency calibration method according to another embodiment of the present invention.

Referring to FIG. 3, the frequency calibration method according to the present invention includes a bank initialization step 310, N-target algorithm steps 320 and 330 including a coarse mode step 320 and a fine mode step 330, an auxiliary search algorithm step 340, and a post search algorithm step 350.

Hereinafter, operations of the frequency synthesizer 200 together with the frequency calibration method shown in FIG. 3 will be descried in detail.

A frequency resolution and AFC lock time that is taken to perform automatic frequency calibration are the most important electric characteristics in design of a frequency synthesizer. The frequency resolution is a minimum unit for frequency detection, and its unit is Hz. For example, if a frequency detector detects a frequency detection value of 100 for an input frequency of 100 MHz, the frequency resolution becomes 1 MHz.

(frequency detection value(natural number))=(input frequency(Hz))/(frequency resolution(Hz))

In general, the frequency resolution and the AFC lock time are traded off. Namely, if the frequency resolution is adjusted to be better, the AFC lock time is increased. If the AFC lock time is adjusted to be decreased, the frequency resolution is worsened. Therefore, the later description is made under the assumption that the frequency resolution and the AFC lock time of the frequency synthesizer according to the present invention are suitably adjusted.

The division number R2 of the divide-by-R frequency detector 261 and the division number N2 of the divide-by-N frequency detector 262 are determined according to hardware implementation of the frequency synthesizer 200 shown in FIG. 2. The division numbers R2 and N2 can be expressed Equation 1.

$$R2 = f_{ref} \cdot T_{cal}$$
$$R2 = F_{res} \cdot T_{cal}$$
$$= F_{res} \cdot \frac{R2}{f_{ref}}$$
[Equation 1]

Here, $f_{ref}$ is a frequency of the reference signal input to the frequency synthesizer 200, and $F_{res}$ is a frequency resolution of the frequency detector, and $T_{cal}$ is a time that is taken for one cycle of the automatic frequency calibration.

In Equation 1, for the desired time $T_{cal}$ and frequency resolution $F_{res}$ of the frequency synthesizer, the R2 and the N2 can be determined. For example, when the $f_{ref}$=20 MHz, $T_{cal}$=10 μs, and $F_{res}$=10 MHz, the R2 and the N2 are determined as follows.

$R2=200(=20\text{ MHz}\times 10\text{ μs})$, $N2=100(=10\text{ MHz}\times R2/20\text{ MHz})$.

In addition, a total AFC lock time $T_{AFC}$ can be expressed by Equation 2.

$T_{AFC}=T_{cal}\cdot 2^{N_{VCObank}}$ (linear search algorithm)

$T_{AFC}=T_{cal}\cdot N_{VCObank}$ (binary search algorithm)

$T_{AFC}=T_{cal}\cdot K$ (N-target algorithm)    [Equation 2]

Here, the $N_{VCObank}$ is a number of bits of digital data indicating the number of banks in the VCO 250, and the K is an iteration number of the automatic frequency calibration performed in the N-target algorithm.

The number of banks may be set to various values. For example, if the number of banks is 20, the $N_{VCObank}$ needs to be at least 5. Therefore, in case of the linear search algorithm, the total AFC lock time $T_{AFC}$ becomes $32T_{cal}$, and in case of the binary search algorithm, the total AFC lock time $T_{AFC}$ becomes $5T_{cal}$. As described later, in case of the N-target algorithm according to the present invention, the total AFC lock time $T_{AFC}$ becomes $3T_{cal}$ or $4T_{cal}$.

The N-target value used as a comparison value in the N-target algorithm is defined by Equation 3.

$$N_{target} = \frac{f_{out} \cdot R2}{f_{ref} \cdot N2 \cdot P}$$    [Equation 3]

Here, $f_{out}$ is an ideal frequency of the output signal that is to be output from the frequency synthesizer 200, and P is a division number of the pre-scaler 271. Since the frequency $f_{ref}$ of the reference signal, the frequency $f_{out}$ of the output signal, R2, N2, and P are determined according to hardware implementation of the frequency synthesizer 200, the N-target value can be easily calculated by using Equation 3.

The N-target algorithm is performed by the state machine 264. The N-target includes a coarse mode and a fine mode.

In the coarse mode, a bank which is equal to the closest to a bank number of a target bank is determined in the shortest time. Subsequently, in the fine mode, a bank which is predicted to be the optimum bank is determined based on the bank determined in the coarse mode. The coarse mode and the fine mode are controlled by the state machine 264. Various well-known controlling methods may be used. The controlling methods can be implanted by the ordinarily skilled in the art, and thus, detailed description thereof is omitted.

1. Bank Initialization 310

In a case where the state machine 264 is used for bank initialization, the bank control signal $AFC_{out}$ is output, so that a bank $N_{center}$ having a center value of bank numbers of the banks in the VCO 250 is set to an initial bank $N_{bank}$. Alternatively, the control voltage VC input to the VCO 250 is set to the reference voltage $V_{ref}$ by using the second switch S2, so that the bank $N_{center}$ having the center value of bank numbers is set to the initial bank $N_{bank}$. In this process, an interaction variable M which is to determine iteration number of frequency calibration cycle and a value of $N_{target}$ in Equation 3 are initialized.

2. Coarse Mode 320

In the coarse mode, the frequency comparator 263 compares the signal $f_{R2}$ output from the divide-by-R frequency divider 261 with the signal $f_{N2}$ output from the divide-by-N frequency divider 262. Since the frequency of the signal $f_{N2}$ output from the divide-by-N frequency divider 262 is higher than that of the signal $f_{R2}$ output from the divide-by-R frequency divider 261, the N-generation value $N_{gen}$ is detected by using one period of the signal $f_{N2}$ output from the divide-by-N frequency divider 262 corresponding to one period of the signal $f_{R2}$ output from the divide-by-R frequency divider 261. The N-generation value will be described later in detail with reference to FIG. 4.

A bank number difference $N_{diff}$ between the currently-determined bank number and the bank number that is to be adjusted based on the detected value can be calculated by using a difference between the N-target value $N_{target}$ defined by Equation 3 and the N-generation value $N_{gen}$ by using the following Equation 4.

$$N_{diff} = \frac{F_{res}}{F_{step}} \times (N_{gen} - N_{target})$$    [Equation 4]

The bank number difference $N_{diff}$ denotes a number that is to be increased or decreased from the currently-determined central bank number I. The $F_{step}$ denotes a frequency of each bank according to an arbitrary value of the control voltage VC. Therefore, the bank number difference $N_{diff}$ is a difference between the N-th bank number and the (N+1)-th bank number under the same control voltage VC and determined in design of the VCO.

Since the frequency of the coarse mode signal PSO output from the pre-scaler 271 is higher than that of the signal generated by the reference divider 210, in the frequency synthesizer according to the present invention, the initial bank can be more accurately determined by performing the coarse mode in comparison with the conventional frequency synthesizer.

In the coarse mode, the N-target value $N_{target}$ and N-generation value $N_{gen}$ can be relatively accurately obtained. Therefore, the bank that is predated to be the optimum bank may be obtained from the current bank during one cycle $T_{cal}$ of the automatic frequency calibration. In addition, although the optimum bank is not determined during one cycle in the coarse mode, the time taken to perform the subsequent searching step can be reduced.

The coarse mode is performed by adjustment of the state machine 264 during one cycle $T_{cal}$ of the automatic frequency calibration.

3. Fine Mode 330

The fine mode is performed by adjustment of the state machine 264. The fine Mode is performed based on the optimum bank obtained in the coarse mode and banks close to the optimum bank. In the fine mode, if a value of the iteration variable M is given to be 2 or 3, the bank number of the optimum bank is searched by using the linear search algorithm during two cycles or three cycles. In the fine mode, the AFC lock time $T_{AFC}$ can be reduced by limiting the iteration number of the automatic frequency calibration to 2 of 3 in advance.

4. Auxiliary Searching Algorithm 340

In most cases, the optimum bank can be determined by performing the aforementioned N-target algorithm including the coarse mode and the fine mode. However, in accrual implantation of the banks in the VCO, the optimum bank may not be determined by performing only the aforementioned N-target algorithm due to a deviation in absolute values of capacitors in the banks and a deviation in frequency ranges covered by the banks. In this case, the linear search algorithm or the binary search algorithms are additionally performed. In these algorithms, the optimum bank is determined by increasing or decreasing the bank number in unit of 1, that is, the minimum unit.

In the present invention, a sum of a time taken to perform the N-target algorithm and a time taken to perform the auxiliary search algorithm is defined as a total AFC lock time.

The frequency synthesizer according to the present invention employs the N-target algorithms 320 and 330, so that the lock time can be shorter than that of the conventional frequency synthesizer. In the conventional frequency synthesizer, the automatic frequency calibration is performed by using only the fine mode 330 or the auxiliary search algorithm 340. Therefore, too much lock time and power consumption is needed for the process of matching the frequency and phase.

5. Post Search Algorithm 350

The pumping voltage monitoring circuit 265 continuously monitors the pumping voltage $V_{cp}$ output form the charge pump 230 and generates the bank adjusting enable signal PSA_En. The bank adjusting enable signal PSA_En is a signal that is a result of determination whether or not a change in width of the pumping voltage $V_{cp}$ can be covered by the currently-set bank. For example, the pumping voltage $V_{cp}$ is compared with the minimum and maximum voltages that can be covered by one bank. If the pumping voltage $V_{cp}$ is less than the minimum voltage or more than the maximum voltage, the automatic frequency calibration loop is operated.

The current-set optimum bank may be determined not to be an optimum bank. In this case, the automatic frequency calibration loop starts from the fine mode 330 according to the bank adjusting enable signal PSA_En so as to change the bank control signal $AFC_{out}$ output from the state machine 264.

In the conventional frequency synthesizer, if a bank is determined to be the optimum bank, it is impossible to change the optimum bank even in a case where environments is changed. However, in the frequency synthesizer 200 according to the present invention, although the optimum bank is determined, the pumping voltage monitoring circuit 265 can determine a new optimum bank by adaptively coping with the environments.

Figure 4:
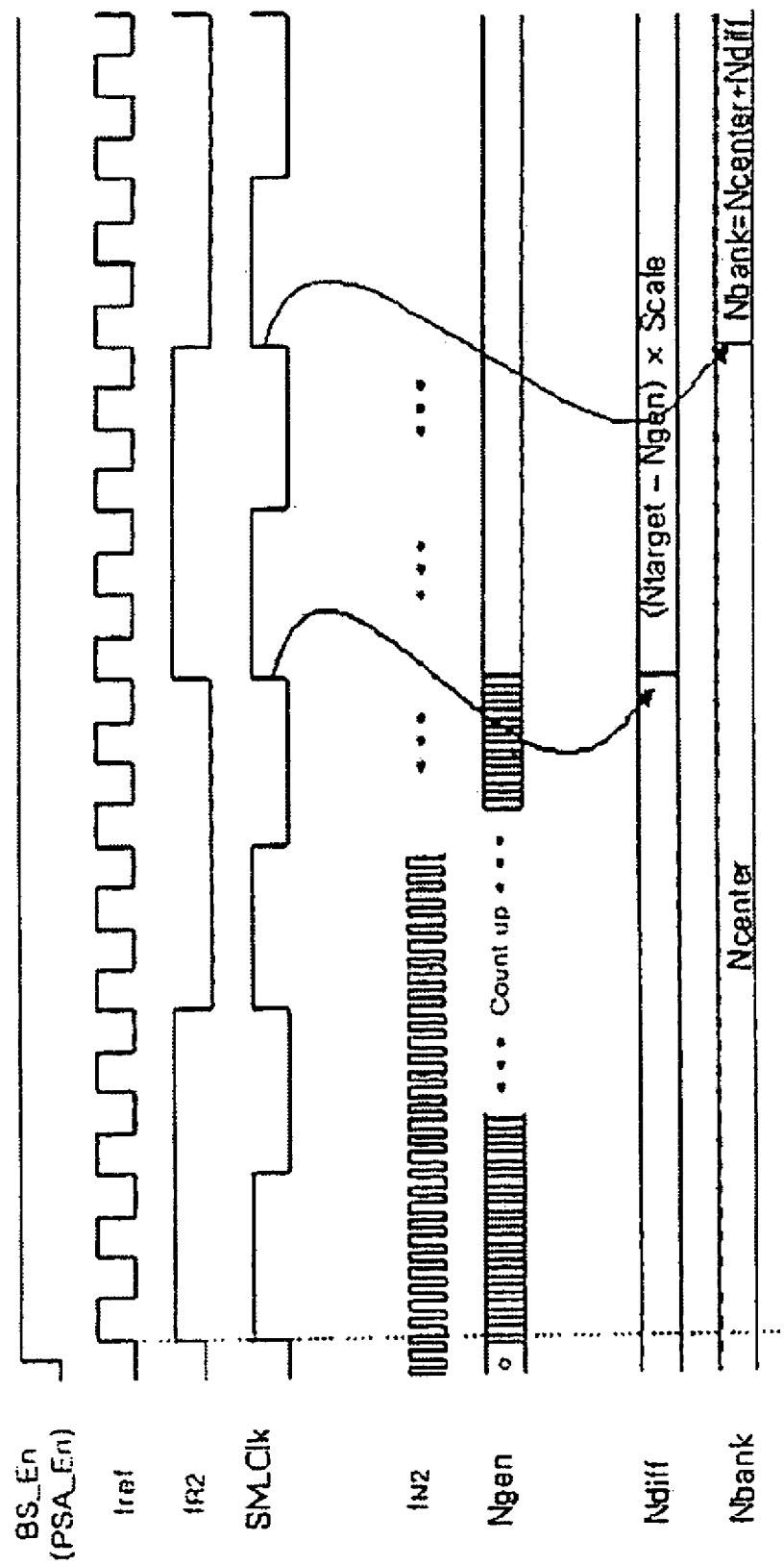
FIG. 4 is a timing diagram of internal signals of an automatic frequency calibration block during an N-target algorithm.

FIG. 4 is a timing diagram of internal signals of an automatic frequency calibration block 260 during the N-target algorithm.

Referring to FIG. 4, when the bank selection enable signal BS-En is changed from a low level to a high level, the N-target algorithm starts. In addition, when the bank adjusting enable signal PSA_En is enabled, the N-target algorithm also starts from the fine mode.

After the bank selection enable signal BS-En or the bank adjusting enable signal PSA_En is enabled, the signal that is obtained by dividing the reference signal $f_{ref}$ with a division number R2 from the timing of a first edge of the reference signal $f_{ref}$ and the operation clock SM_ClK for operating the state machine 260 are generated. Although not shown in FIG. 2, the state machine 260 is operated according to the operation clock SM_Clk.

A period of the signal $f_{N2}$ that is obtained by dividing the frequency of the coarse mode signal PSO included in a time interval of one period of the signal $f_{R2}$ that is obtained by dividing the frequency of the reference signal $f_{ref}$ is counted, so that the N-generation number $N_{gen}$ is obtained. Here, the coarse mode signal PSO is a signal that is obtained by dividing the frequency of the oscillating signal output form the VCO.

Next, just after the N-generation value $N_{gen}$ is counted, the bank number difference $N_{diff}$, that is, the to-be-shifted bank number in one cycle of the first operation clock SM_Clk is determined (see Equation 4). The bank number $N_{bank}$ is shifted in the next one cycle of the operation clock SM_Clk according to the bank number difference $N_{diff}$.

Figure 5:
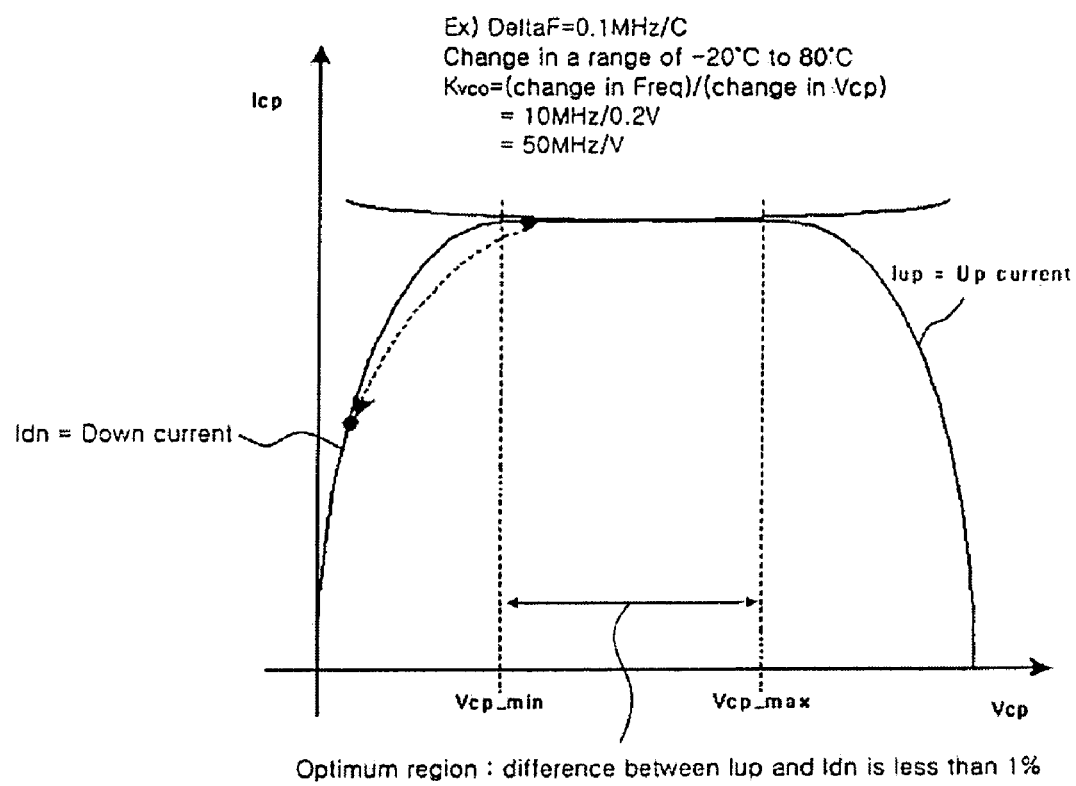
FIG. 5 is a graph illustrating a change in an output current of a charge pump with respect to a change in a pumping voltage.

FIG. 5 is a graph illustrating a change in the output current of the charge pump with respect to a change in the pumping voltage $V_{cp}$.

Referring to FIG. 5, in a frequency range that can be covered by the bank, that is, in a range between the maximum voltage $V_{cp}$-min and the maximum voltage $V_{cp}$-max, a phase locked loop (PLL) can be normally operated under the condition that the a change in a current Ipu charged by the charge pump 230 or a current Idn discharged to the charge pump 230 is less than about 1%.

When the pumping voltage $V_{cp}$ is in a range between the minimum voltage $V_{cp\_}$min and the maximum voltage $V_{cp\_}$max, the PLL is in a frequency-locked state according to the voltage level of the pumping voltage $V_{cp}$. Although the frequency locking is obtained, the frequency of the oscillating signal output from the VCO may be changed with a rate of 0.1 MHz/C according to a change in temperature of the PLL circuit. In a temperature range of −20° C. to 80° C., the frequency of the oscillating signal output from the VCO is changed with a rate of 100 MHz/C according to a change in temperature of 1° C. in the PLL circuit.

According to the definition of the gain $K_{vco}$ of the VCO, the gain becomes 50 MHz/V under the conduction that an allowable difference between the minimum voltage $V_{cp}$-min and the maximum voltage $V_{cp}$-max 0.2V. In other words, in a case where the gain $K_{vco}$ is more than 50 MHz/V, the PLL can be normally operated.

In a case where the conditions of the PLL or the environments of the PLL are changed, particularly, even in a case where the pumping voltage $V_{cp}$ deviates from the range between the minimum voltage $V_{cp}$-min and the maximum voltage $V_{cp}$-max due to the change in temperature, the post search algorithm according to the present invention is performed, so that the bank number can be adjusted.

According to the present invention, frequency calibration is rapidly and simply performed at a coarse mode by using a reference signal and an output of a pre-scaler, so that it is possible to reduce power consumption of a frequency synthesizer and to reduce an area where the frequency synthesizer is implemented. Particularly, frequency locking can be obtained in a short time, and a VCO having a small gain $K_{vco}$ can be used, so that it is possible to effectively reduce noises.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A frequency synthesizer comprising:
    a reference divider which divides a frequency of a reference signal with a division ratio of 1/(R1), wherein the R1 is an integer;
    a phase detector which outputs a pulse corresponding to a phase difference between a fine mode signal and a signal output from the reference divider;
    a main divider which outputs a coarse mode signal and the fine mode signal by using the output signal of the reference divider;
    a charge pump which generates a pumping voltage corresponding to a width and sign of the pulse output from the phase detector;
    a loop filter which removes noises generated during operation of frequency calibration loop and determines a voltage level of the pumping voltage;
    a first switch which transfers the pumping voltage applied to the one terminal thereof to a VCO (voltage control oscillator) connected to the other terminal thereof in response to a first switch control signal;
    a second switch which transfers a reference voltage applied to the one terminal thereof to the VCO connected to the other terminal in response to a second switch control signal;
    the VCO which outputs the output signal corresponding to a frequency control signal and a control voltage applied through the first and second switches; and
    a automatic frequency calibration block which generates the frequency control signal, the first switch control signal the first switch control signal, and the second switch control signal in response to the pumping voltage, the reference signal, and the coarse mode signal.

2. The frequency synthesizer of claim 1, wherein the main divider comprises:
    a pre-scaler which divides a frequency of the output signal with a division ratio of 1/P to generate the coarse mode signal, wherein the P is an integer;
    a sigma-delta modulator which modulates an output of the reference divider to generate a division control signal; and
    a program divider which divides the coarse mode signal output from the pre-scaler with a division ratio of 1/(N1) in response to the division control signal to generate the fine mode signal, wherein the N1 is an integer.

3. The frequency synthesizer of claim 2, wherein the sigma-delta modulator has a fourth-order MASH (multi-stage-noise-shaping) structure having a 20-bit resolution.

4. The frequency synthesizer of claim 1,
    wherein the first and second switch control signals are exclusively enabled, and
    wherein the control voltage has a voltage level of one of the reference signal and the output signal of the loop filter.

5. The frequency synthesizer of claim 1, wherein the automatic frequency calibration block comprises:
    a divide-by-R frequency divider which divides the frequency of the reference signal with a division ratio of 1/(R2) to generate a first frequency-divided signal, and wherein the R2 is integer;
    a divide-by-N frequency divider which divides a frequency of the coarse-mode signal with a division ratio of 1/(N2) to generate a second frequency-divided signal, and wherein the N2 is integer;
    a frequency comparator which generates a comparison signal corresponding to a frequency difference between the first and second frequency-divided signals that are output from the divide-by-R frequency divider and the divide-by-N frequency divider in response to a control signal.
    a state machine which generate the frequency control signal, the first switch control signal, the second switch control signal, and the control signal by using the comparison signal and a bank adjusting enable signal; and
    a pumping voltage monitoring circuit which compares the pumping voltage with the reference voltage to generate the bank adjusting enable signal.

6. The frequency synthesizer of claim 5, wherein the division number R2 of the divide-by-R frequency detector is smaller than the division number R1 of the reference divider.

7. The frequency synthesizer of claim 5, wherein the reference voltage is a minimum voltage and a maximum voltage which can be covered by a currently-set bank.

8. An automatic frequency calibration circuit comprising:
    a divide-by-R frequency divider which divides a frequency of the reference signal with a division ratio of 1/(R2) to generate a first frequency-divided signal, wherein the reference signal used to synthesize a frequency by using VCO (voltage controlled oscillator), and wherein the R2 is an integer;
    a divide-by-N frequency divider divides a frequency of a coarse mode signal with a division ratio of 1/(N2) to generates a second frequency-divided signal, wherein the coarse mode signal is generated by dividing a frequency of an output signal of the VCO with a division ratio of 1/P, and wherein the P and the N2 are integers;
    a frequency comparator which generates a comparison signal corresponding to a frequency difference between the first and second frequency-divided signals output from the divide-by-R frequency divider and the divide-by-N frequency divider in response to a control signal;
    a pumping voltage monitoring circuit which compares a reference voltage with a pumping voltage that are used to determine a frequency of an output signal of the VCO to generate a bank adjusting enable signal; and
    a state machine which generates the frequency control signal and the control signal by using the comparison signal and the bank adjusting enable signal.

9. The automatic frequency calibration circuit of claim 8, wherein the reference voltage is a minimum voltage and a maximum voltage which can be covered by a currently-set bank.

10. A frequency calibration method in the frequency synthesizer of claim 5, comprising:
    an initialization step of determining an arbitrary one of banks built in the VCO as an initial bank and determining an iteration variable and an N-target value;
    an N-target algorithm step of calculating an N-generation value by using the reference signal and the coarse mode signal that is generated by dividing the frequency of the oscillating signal generated by using the initial bank and changing a bank number by using a difference between the N-target value and the N-generation value according to the iteration variable;

an auxiliary search algorithm step of searching for an optimum bank if a bank determined by using the N-target algorithm is determined to be the optimum bank; and a post search algorithm step of performing frequency calibration from the N-target algorithm again when a predetermined time elapses after determination of the optimum bank in the N-target algorithm step and/or the auxiliary search algorithm step, if the previously-determined bank is determined not to be the optimum bank.

11. The frequency calibration method of claim 10,
wherein a bank number of the arbitrary one bank is a central number of a plurality of the bank number,
wherein the iteration variable determines the number of frequency calibration loops which are to be performed in the N-target algorithm,
wherein the N-target value satisfies the following Equation, and $$N_{target} = \frac{f_{out} \cdot R2}{f_{ref} \cdot N2 \cdot P}$$

wherein $f_{ref}$ is the frequency of the reference signal, $f_{out}$ is the frequency of the oscillating signal, R2 is the division number of the divide-by-R frequency detector, N2 is the division number of the divide-by-N frequency detector, and P is the division number of the output signal which is used to generate the coarse mode signal.

12. The automatic frequency calibration circuit of claim 11, wherein the N-target algorithm step comprises:
a coarse mode step of calculating an N-generation value generated by using the reference signal and the coarse mode signal generated by dividing a frequency of the oscillating signal generated by using the initial bank with the division number P and primarily changing the bank number by a bank number that is to be shifted by using a difference between the N-generation value and the N-target value, wherein the P is an integer; and
a fine mode step of searching for the more optimum bank by using the bank obtained by performing the coarse mode step,
wherein in the coarse mode, the bank is shifted in one cycle of searching, and in the fine mode, the bank is shifted by iteratively performing the searching cycle by the number of the iteration variable.

13. The automatic frequency calibration circuit of claim 12,
wherein the N-generation value is a period of the signal obtained by dividing the frequency of the coarse mode signal with a division number of N2, and the coarse mode signal corresponds to one period of the signal obtained by dividing the frequency of the reference signal with a division number of R2,
wherein the to-be-shifted bank number satisfies the following Equation, $$N_{diff} = \frac{F_{res}}{F_{step}} \times (N_{gen} - N_{target})$$

wherein the $F_{res}$ denotes a frequency resolution determined based on the N2 and R2, and the $F_{step}$ denotes a frequency difference between the banks with respect to the control voltage VC input to the VCO, and
wherein the bank number that is primarily shift satisfies the following equation, $$N_{bank} = N_{center} + N_{diff}.$$

14. The frequency calibration method of claim 13, wherein in the fine mode, the frequency is calibrated by using a linear searching scheme.

15. The frequency calibration method of claim 14, wherein in the auxiliary search algorithm, the pumping voltage and the reference voltage are compared to each other, and if the pumping voltage is not in a range of the reference voltage, an optimum bank is searched by using a linear searching scheme or a binary searching scheme.

16. The frequency calibration method of claim 15, wherein the optimum bank is searched by increasing or decreasing the bank number by 1 by using information which is obtained by using the linear searching scheme or the binary searching scheme.

17. The frequency calibration method of claim 15,
wherein the reference voltage is a maximum voltage and a minimum voltage that can be covered by a currently-set bank, and
wherein, if the pumping voltage is larger than the maximum voltage, bank number is increased by 1, and if the pumping voltage is smaller than the minimum voltage, the bank number is decreased by 1.

18. The frequency calibration method of claim 15, wherein the post search algorithm step is performed in a case where the pumping voltage is in a range of the reference voltage.

* * * * *